United States Patent [19]
Yamashita et al.

[11] Patent Number: 5,410,209
[45] Date of Patent: Apr. 25, 1995

[54] PIEZOELECTRIC MATERIAL AND ULTRASONIC PROBE

[75] Inventors: Yohachi Yamashita, Yokohama; Shiroh Saitoh, Tokyo, both of Japan

[73] Assignee: Kabushiki Kaisha Toshiba, Kawasaki, Japan

[21] Appl. No.: 187,055

[22] Filed: Jan. 27, 1994

[30] Foreign Application Priority Data

Jan. 27, 1993 [JP] Japan .................. 5-011250

[51] Int. Cl.⁶ .................. H01L 41/08; C04B 35/49
[52] U.S. Cl. .................. 310/334; 310/358; 252/62.9
[58] Field of Search .............. 310/311, 358, 334, 336, 310/337; 252/62.9; 501/134, 135, 136

[56] References Cited

U.S. PATENT DOCUMENTS

| | | | |
|---|---|---|---|
| 3,663,440 | 5/1972 | Thomann | 310/334 X |
| 4,024,081 | 5/1977 | Ohmori et al. | 252/62.9 |
| 4,313,839 | 2/1982 | Fesenko et al. | 252/62.9 |
| 4,830,996 | 5/1989 | Hirai et al. | 501/136 |
| 4,985,381 | 1/1991 | Mori et al. | 501/136 |
| 5,141,903 | 8/1992 | Kawabata et al. | 501/134 |
| 5,288,474 | 2/1994 | Reichert et al. | 423/593 |

OTHER PUBLICATIONS

Hiromu Ouchi, et al., "Piezoelectric Properties of Pb(Mg$\frac{1}{3}$Nb$\frac{2}{3}$)O3-PbTiO3-PbZrO3 Solid Solution Ceramics", Journal of The American Ceramic Society-Ouchi et al., vol. 48, No. 12, 1965, pp. 630–635.

J. J. Dih, et al., "Sintering of Sc-Modified Lead Zirconate-Titanate", Journal of The American Ceramic Society-Discussions and Notes, vol. 60, No. 1-2, 1977, pp. 92–93.

Victor J. Tennery, et al., "Ferroelectric and Structrual Properties of the Pb(Sc$\frac{1}{2}$ Nb$\frac{1}{2}$)1-x TixO3 System", Journal of The American Ceramic Society, vol. 51, No. 12, Dec. 21, 1968, pp. 671–674.

*Primary Examiner*—Mark O. Budd
*Attorney, Agent, or Firm*—Oblon, Spivak, McClelland, Maier & Neustadt

[57] ABSTRACT

A piezoelectric material with a high fracture toughness and a large electromechanical coupling coefficient is disclosed. This piezoelectric material contains a composition which is represented by $xPb(Sc_{\frac{1}{2}}Nb_{\frac{1}{2}})O_3$-$yPbTiO_3$-$zPbZrO_3$-$wPb(Me_{\frac{1}{3}}Nb_{\frac{2}{3}})O_3$, where Me is at least one metal selected from the group consisting of Mg, Zn and Ni, and $x+y+z+w=1.00$, x, y, z, and w being values falling within region which is defined by connecting points a, b, c, and d and which excludes a line ab, the points a, b, c, and d existing on the faces of a regular trigonal pyramid having apices $P_1$, $P_2$, $P_3$, and $P_4$ which correspond to $Pb(Sc_{\frac{1}{2}}Nb_{\frac{1}{2}})O_3$, $PbTiO_3$, $PbZrO_3$ and $Pb(Me_{\frac{1}{3}}Nb_{\frac{2}{3}})O_3$, respectively, and the points a, b, c, and d having the following coordinate values when the apices $P_1$, $P_2$, $P_3$, and $P_4$ have coordinate values of $(X_1, Y_1, Z_1, W_1=1, 0, 0, 0)$, $(X_2, Y_2, Z_2, W_2=0, 1, 0, 0)$, $(X_3, Y_3, Z_3, W_3=0, 0, 1, 0)$, and $(X_4, Y_4, Z_4, W_4=0, 0, 0, 1)$:

| | X | Y | Z | W |
|---|---|---|---|---|
| a | 0.72 | 0.28 | 0.00 | 0.00 |
| b | 0.02 | 0.98 | 0.00 | 0.00 |
| c | 0.02 | 0.28 | 0.70 | 0.00 |
| d | 0.02 | 0.20 | 0.00 | 0.78 |

14 Claims, 4 Drawing Sheets

$P_1 (X_1, Y_1, Z_1, W_1 = 1,0,0,0)$
$P_2 (X_2, Y_2, Z_2, W_2 = 0,1,0,0)$
$P_3 (X_3, Y_3, Z_3, W_3 = 0,0,1,0)$
$P_4 (X_4, Y_4, Z_4, W_4 = 0,0,0,1)$
a (X=0.72, Y=0.28, Z=0.00, W=0.00)
b (X=0.02, Y=0.98, Z=0.00, W=0.00)
c (X=0.02, Y=0.28, Z=0.70, W=0.00)
d (X=0.02, Y=0.20, Z=0.00, W=0.78)

$P_3$; $PbZrO_3$
$P_4$; $Pb(Me_{1/3} Nb_{2/3})O_3$
$P_1$; $Pb(Sc_{1/2} Nb_{1/2})O_3$
$P_2$; $PbTiO_3$

PIEZOELECTRIC MATERIAL AND ULTRASONIC PROBE

BACKGROUND OF THE INVENTION

1. Field of the Invention

The present invention relates to a piezoelectric material suitable for a piezoelectric element and an ultrasonic probe which includes the piezoelectric element consisting of the piezoelectric material and is useful in, e.g., a medical diagnosing apparatus.

2. Description of the Related Art

An ultroaonic probe has an ultrasonic transmitting/receiving element having a piezoelectric element. The ultrasonic probe is used for imaging the internal state of a target by radiating an ultrasonic wave toward the target and receiving an echo reflected by an interface having a different acoustic impedance of the target. An ultrasonic imaging apparatus incorporating such an ultrasonic probe is applied to, e.g., a medical diagnosing apparatus for inspecting the interior of a human body and an inspecting apparatus for inspecting the interior of a metal welding portion.

As an example of the medical diagnosing apparatus, in addition to the tomographic image (B mode image) display of the human body, there has been recently developed an apparatus employing the "Color Flow Mapping (CFM) method" capable of performing two-dimensional color display of the speed of the blood flow of, e.g., the heart, liver, and carotid artery, by utilizing a Doppler shift in ultrasonic wave caused by the blood flow. The diagnosing performance has been remarkably improved by this medical diagnosing apparatus. The medical diagnosing apparatus employing the CFM method is used for diagnosis of all the internal organs, e.g., the uterus, liver, and spleen, of the human body. Further studies are in progress aiming at an apparatus capable of diagnosing coronary thrombus.

In the case of the former B mode image, a high-resolution image must be obtained at a high sensitivity so that even a small change to a morbid state and a body cavity at a deep location caused by a change in body can be clearly seen. In the latter Doppler mode capable of obtaining a CFM image, since the echo reflected by a small blood cell having a diameter of about several fm is used, the obtained signal level is lower than that obtained in the B mode image, and thus a higher sensitivity is required.

Conventionally, ultrasonic transmitting/receiving elements having the structures as follows are used in terms of their performance:

(1) Ultrasonic attenuation caused by irradiating a living body with an ultrasonic wave by an ultrasonic probe is about 0.5 to 1 dB/MHz.cm except in bones. Thus, in order to obtain a high-sensitivity signal from the human body, it is preferable to decrease the frequency of the ultrasonic wave radiated by the ultrasonic transmitting/receiving element. When, however, the frequency is excessively decreased, the wavelength of the frequency is increased to sometimes degrade the resolution. Therefore, an ultrasonic wave having a frequency of 2 to 10 MHz is usually radiated.

(2) The piezolelectric element of the ultrasonic transmitting/receiving element must be constituted by a material having a large electromechanical coupling coefficient and a large dielectric constant so that loss caused by cables and the stray capacitance of the apparatus is small and that the piezolelectric element be easily matched with a transmitting/receiving circuit. For this reason, the piezoelectric element is mainly constituted by a lead zirconate titanate (PZT)-based ceramic.

(3) An array-type ultrasonic probe constituted by arranging several tens to about 200 ultrasonic transmitting/receiving elements each having a rectangular piezoelectric element has a high resolution.

The above conventional ultrasonic probes, however, have the following problems.

That is, in the array-type ultrasonic probe, the number of piezoelectric elements tends to increase as the resolution of the probe is increased. To bring the ultrasonic probe of this type into contact with a human body, the width of the piezoelectric element must be decreased since the diameter of an ultrasonic radiating surface cannot be increased. A dicer used in cutting semiconductor silicon wafers or the like is used to form rectangular piezoelectric, elements each having a width of 100 $\mu$m or smaller from a block of a PZT-based ceramic. Since, however, the piezoelectric element readily cracks during cutting using the dicer, a piezoelectric material with a higher fracture toughness is required.

In addition, if the number of piezoelectric elements is increased in the above ultrasonic probe, the impedance per piezoelectric element rises to make it difficult to obtain impedance matching with the driving circuit. This problem of poor matching can be avoided by use of PZT with a large dielectric constant. However, the electromechanical coupling coefficient of the PZT-based ceramic described above decreases if its permittivity exceeds 3,000. This introduces another problem of a decrease in sensitivity.

As described above, in the manufacturing process of the ultrasonic probe using the PZT as the piezoelectric element, cracks readily occur if the width of the piezoelectric element is decreased to about 100 $\mu$m or smaller. In addition, an electromechanical coupling coefficient $k_{33}'$ in the direction of thickness tends to decrease in the above-mentioned rectangular piezoelectric element with a small width.

V. J. TENNERY et al., on the other hand, have reported the use of a $Pb(Sc_{\frac{1}{2}}Nb_{\frac{1}{2}})O_3$-$PbTiO_3$-based ceramic composition as a piezoelectric material in place of the PZT in J. AM. CERAM. SOC., VOL. 51, NO. 12, pp. 671–673 (1968). Since, however, the sintering temperature of this ceramic material is extremely high, 1,320° to 1,385° C., a large amount of lead oxide evaporates during sintering, resulting in a low sintering density which is 93% or less of a theoretical density. For this reason, this ceramic composition is not sufficiently satisfactory in respect of fracture toughness. Consequently, cracks occur if a piezoelectric element with a thickness of 100 $\mu$m or smaller is cut out from a block of this ceramic composition in order to apply the ceramic composition to an ultrasonic probe. In addition, an electromechanical coupling coefficient $k_p$ of the above piezoelectric element is small, a maximum of at most 46%, which is an unattractive value compared to that ($k_p$: 60% or higher) of the PZT. It is therefore impossible to use this piezoelectric material as the piezoelectric element of an ultrasonic probe.

SUMMARY OF THE INVENTION

It is an object of the present invention to provide a piezoelectric composition with a high fracture toughness and a large electromechanical coupling coefficient ($k_{33}'$).

It is another object of the present invention to provide an ultrasonic probe which includes a piezoelectric element with a small width and a large electromechanical coupling coefficient ($k_{33}'$), and by which matching with a transmitting/receiving circuit can be obtained easily and high sensitivity can be obtained.

According to the present invention, there is provided a piezoelectric material containing a composition which is represented by $xPb(Sc_{\frac{1}{2}}Nb_{\frac{1}{2}})O_3\text{-}yPbTiO_3\text{-}zPbZrO_3\text{-}wPb(Me_{\frac{1}{3}}Nb_{\frac{2}{3}})O_3$, where Me is at least one metal selected from the group consisting of Mg, Zn and Ni, and $x+y+z+w=1.00$, x, y, z, and w being values falling within a region which is defined by connecting points a, b, c and d and which excludes a line ab, the points a, b, c and d existing on the faces of a regular trigonal pyramid having apices $P_1$, $P_2$, $P_3$ and $P_4$ which correspond to $Pb(Sc_{\frac{1}{2}}Nb_{\frac{1}{2}})O_3$, $PbTiO_3$, $PbZrO_3$ and $Pb(Me_{\frac{1}{3}}Nb_{\frac{2}{3}})O_3$, respectively, and the points a, b, c and d having the following coordinate values when the apices $P_1$, $P_2$, $P_3$ and $P_4$ have coordinate values of ($X_1$, $Y_1$, $Z_1$, $W_1 = 1, 0, 0, 0$), ($X_2$, $Y_2$, $Z_2$, $W_2 = 0, 1, 0, 0$), ($X_3$, $Y_3$, $Z_3$, $W_3 = 0, 0, 1, 0$), and ($X_4$, $Y_4$, $Z_4$, $W_4 = 0, 0, 0, 1$):

|   | X    | Y    | Z    | W    |
|---|------|------|------|------|
| a | 0.72 | 0.28 | 0.00 | 0.00 |
| b | 0.02 | 0.98 | 0.00 | 0.00 |
| c | 0.02 | 0.28 | 0.70 | 0.00 |
| d | 0.02 | 0.20 | 0.00 | 0.78 |

According to the present invention, there is provided an ultrasonic probe comprising:

a piezoelectric element having an ultrasonic transmitting/receiving surface; and a pair of electrodes formed on the ultrasonic transmitting/receiving surface of the piezoelectric element and a surface opposite to the transmitting/receiving surface, respectively, and wherein the piezoelectric element consists of a piezoelectric material containing a composition which is represented by $xPb(Sc_{\frac{1}{2}}Nb_{\frac{1}{2}})O_3\text{-}ypbTiO_3\text{-}zPbZrO_3\text{-}wPb(Me_{\frac{1}{3}}Nb_{\frac{2}{3}})O_3$, where Me is at least one metal selected from the group consisting of Mg, Zn and Ni, and $x+y+z+w=1.00$, x, y, z, and w being values falling within a region which is defined by connecting points a, b, c and d and which excludes a line ab, the points a, b, c and d existing on the faces of a regular trigonal pyramid having apices $P_1$, $P_2$, $P_3$ and $P_4$ which correspond to $Pb(Sc_{\frac{1}{2}}Nb_{\frac{1}{2}})O_3$, $PbTiO_3$, $PbZrO_3$ and $Pb(Me_{\frac{1}{3}}Nb_{\frac{2}{3}})O_3$, respectively, and the points a, b, c and d having the following coordinate values when the apices $P_1$, $P_2$, $P_3$ and $P_4$ have coordinate values of ($X_1$, $Y_1$, $Z_1$, $W_1 = 1, 0, 0, 0$), ($X_2$, $Y_2$, $Z_2$, $W_2 = 0, 1, 0, 0$), ($X_3$, $Y_3$, $Z_3$, $W_3 = 0, 0, 1, 0$), and $X_4$, $Y_4$, $Z_4$, $W_4 = 0, 0, 0, 1$):

|   | X    | Y    | Z    | W    |
|---|------|------|------|------|
| a | 0.72 | 0.28 | 0.00 | 0.00 |
| b | 0.02 | 0.98 | 0.00 | 0.00 |
| c | 0.02 | 0.28 | 0.70 | 0.00 |
| d | 0.02 | 0.20 | 0.00 | 0.78 |

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
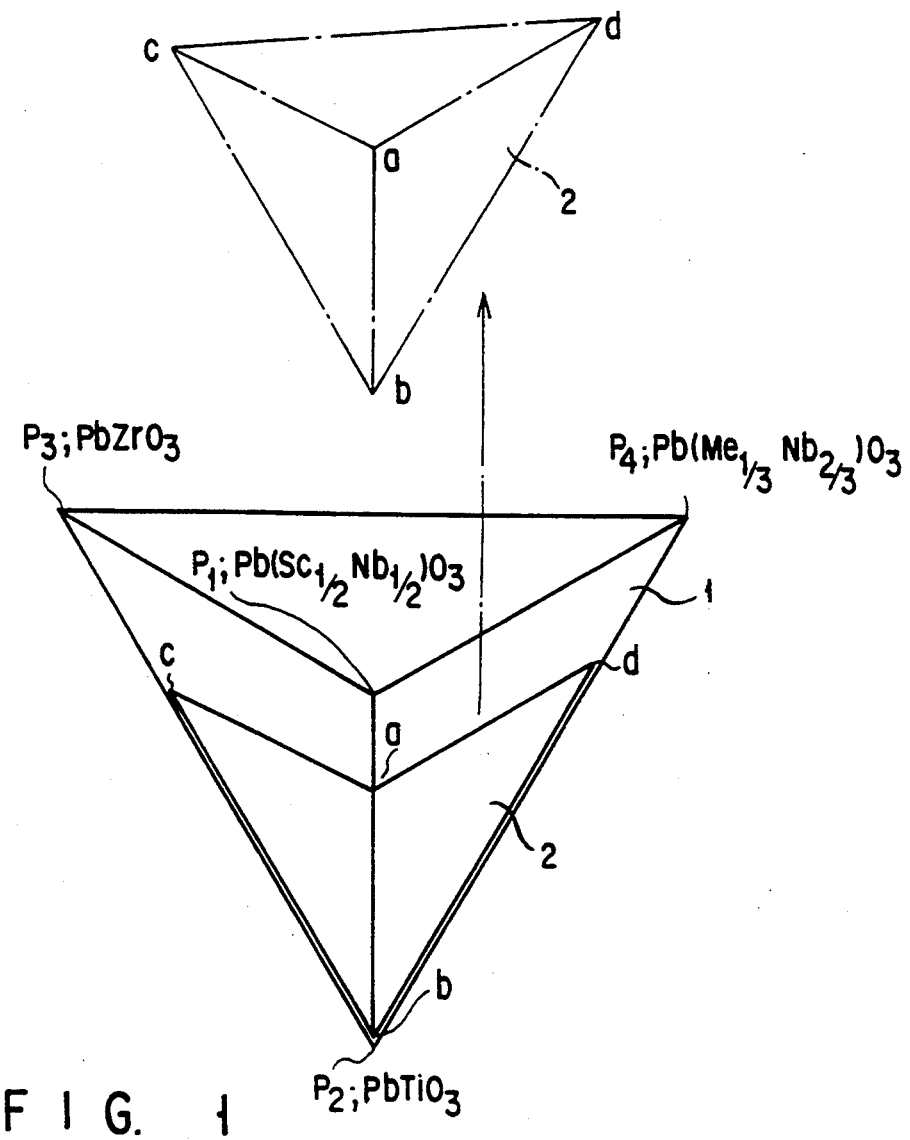
FIG. 1 is a four-element view showing the composition range of a composition contained in a piezoelectric material according to the present invention.

A piezoelectric material according to the present invention contains a composition which is represented by $xPb(Sc_{\frac{1}{2}}Nb_{\frac{1}{2}})O_3\text{-}yPbTiO_3\text{-}zPbZrO_3\text{-}wPb(Me_{\frac{1}{3}}Nb_{\frac{2}{3}})O_3$, where Me is at least one metal selected from the group consisting of Mg, Zn and Ni, and $x+y+z+w=1.00$. Here, x, y, z, and w are values falling within a region which is defined by connecting points a, b, c and d and which excludes a line ab. More specifically, as shown in FIG. 1, a regular trigonal pyramid 1 has apices $P_1$, $P_2$, $P_3$ and $P_4$ which correspond to $Pb(Sc_{\frac{1}{2}}Nb_{\frac{1}{2}})O_3$, $PbTiO_3$, $PbZrO_3$ and $Pb(Me_{\frac{1}{3}}Nb_{\frac{2}{3}})O_3$, respectively. The apices $P_1$, $P_2$, $P_3$ and $P_4$ have coordinate values of ($X_1$, $Y_1$, $Z_1$, $W_1 = 1, 0, 0, 0$), ($Z_2$, $Y_2$, $Z_2$, $W_2 = 0, 1, 0, 0$), ($X_3$, $Y_3$, $Z_3$, $W_3 = 0, 0, 1, 0$), and ($X_4$, $Y_4$, $Z_4$, $W_4$, $= 0, 0, 0, 1$). The midpoint of the perpendicular distance from the apex $P_1$ of the pyramid 1 to the plane of the base thereof is represented by coordinate values ($X = 0.5$, $Y = 0.5/3$, $Z = 0.5/3$, $W = 0.5/3$). The regular triangle defined by the plane parallel to the base plane of the pyramid 1 and located at the midpoint of said perpendicular distance is represented by coordinate values ($X = 0.5$, $Y + Z + W = 0.5$).

The points a, b, c and d defining said region are located on the faces of the trigonal pyramid 1 and have the following coordinate values:

|   | X    | Y    | Z    | W    |
|---|------|------|------|------|
| a | 0.72 | 0.28 | 0.00 | 0.00 |
| b | 0.02 | 0.98 | 0.00 | 0.00 |

-continued

|   | X | Y | Z | W |
|---|---|---|---|---|
| c | 0.02 | 0.28 | 0.70 | 0.00 |
| d | 0.02 | 0.20 | 0.00 | 0.78 |

In other words, x, y, z, and w are defined as values found in a region drawn as a trigonal pyramid 2 by linearly connecting points a (X=0.02, Y=0.98, Z=0.00, W=0.00), b (X=0.02, Y=0.98, Z=0.00, W=0.00), c (X=0.02, Y=0.28, Z=0.70, W=0.00), and d (X=0.02, Y=0.02, Z=0.00, W=0.78), all existing on the faces of the regular trigonal pyramid 1 shown in FIG. 1, the region excluding the line ab.

The piezoelectric material specified above assumes a form of a sintered body. In some cases, however, the material may take a form of a single crystal, depending on the composition ratio.

The reason why the values of x, y, z, and w of the composition contained in the piezoelectric material according to the present invention are defined will be described below.

If the values of x, y, z, and w are outside a line ac of the region defined by the trigonal pyramid 2 shown in FIG. 1, an electromechanical coupling coefficient $k_{33}'$ in the direction of thickness decreases to 50% or less when a block consisting of the piezoelectric material containing this composition is formed into a rectangular piezoelectric element with a width of 100 μm or smaller. In addition, it is difficult to sufficiently increase the density of the piezoelectric material containing this composition since a large amount of lead oxide evaporates during sintering.

If the values of x, y, z, and w are outside a line ad of the region defined by the trigonal pyramid 2 shown in FIG. 1, the electromechanical coupling coefficient $k_{33}'$ in the direction of thickness decreases to 50% or less when a block consisting of the piezoelectric material containing this composition is formed into a rectangular piezoelectric element with a width of 100 μm or smaller. In addition, the Curie temperature of the piezoelectric material containing this composition, which indicates the upper limit of the operating temperature of a piezoelectric element, becomes 150° C. or lower.

If the values of x, y, z, and w are outside a line bc of the region defined by the trigonal pyramid 2 shown in FIG. 1, no high fracture toughness can be obtained even with addition of an oxide such as $La_2O_3$ (to be described later). In addition, the electromechanical coupling coefficient $k_{33}'$ in the direction of thickness decreases when a block consisting of the piezoelectric material containing this composition is formed into a rectangular piezoelectric element with a width of 100 μm or smaller.

If the values of x, y, z, and w are outside a line bd of the region defined by the trigonal pyramid 2 shown in FIG. 1, a pyrochroite phase with a small dielectric constant readily forms in the composition.

A piezoelectric material (e.g., a sintered body), therefore, which contains a composition in which the values of x, y, z, and w are within the region defined by the trigonal pyramid 2 illustrated in FIG. 1, but not including the line ab, has a high fracture toughness, can suppress occurrence of cracks during cutting, and has a large electromechanical coupling coefficient ($k_{33}'$).

In the composition contained in the piezoelectric material according to the present invention, it is preferable that all of $Pb(Sc_{\frac{1}{2}}Nb_{\frac{1}{2}})O_3$, $PbTiO_3$, $PbZrO_3$ and $Pb(Me_{\frac{1}{2}}Nb_{\frac{2}{3}})O_3$ are contained.

Figure 2:
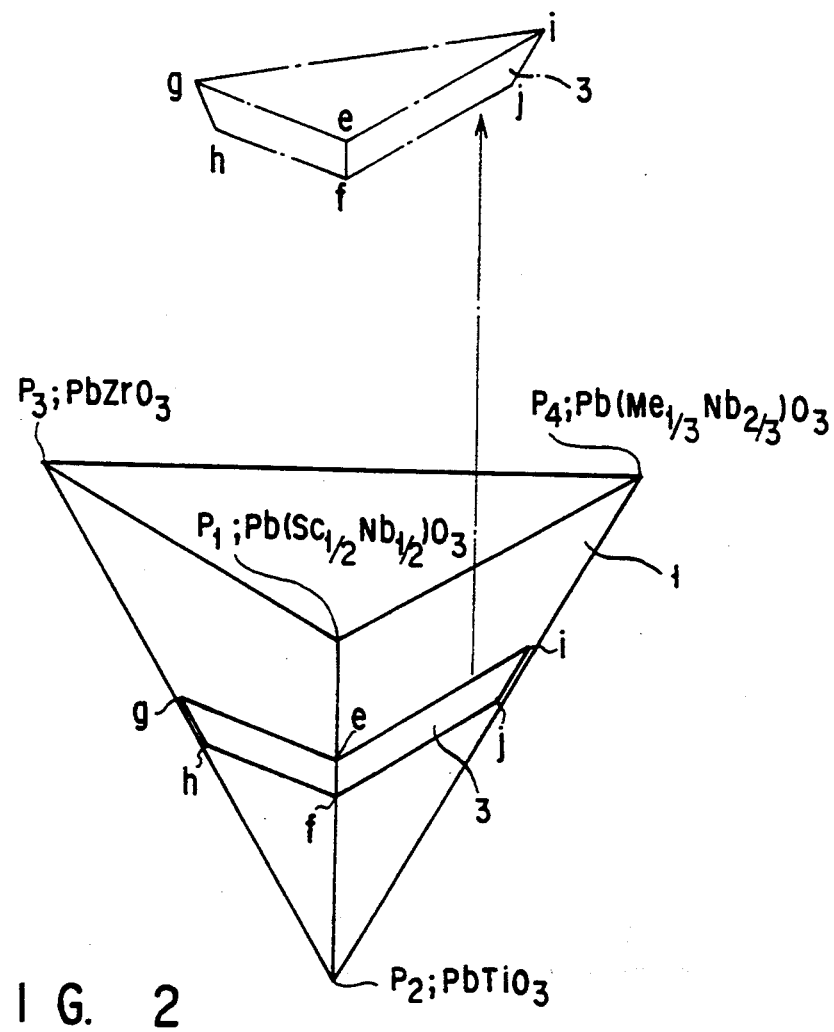
FIG. 2 is a four-element view showing a narrower composition range of the composition contained in the piezoelectric material according to the present invention.

In the composition contained in the piezoelectric material according to the present invention, as shown in FIG. 2, it is preferable that x, y, z and w are values following with a region which is defined by connected points e, f, g, h, i and j and excludes a line ef. More specifically, as shown in FIG. 2, a regular trigonal pyramid 1 has apices $P_1$, $P_2$, $P_3$ and $P_4$ which correspond to $Pb(Sc_{\frac{1}{2}}Nb_{\frac{1}{2}})O_3$, $PbTiO_3$, $PbZrO_3$, and $Pb(Me_{\frac{1}{2}}Nb_{\frac{2}{3}})O_3$, respectively. Assuming that the apices $P_1$, $P_2$, $P_3$ and $P_4$ have coordinate values of $(X_1, Y_1, Z_1, W_1=1, 0, 0, 0)$, $(X_2, Y_2, Z_2, W_2=0, 1, 0, 0)$, $(X_3, Y_3, Z_3, W_3, =0, 0, 1, 0)$ and $(W_4, Y_4, Z_4, W_4=0, 0, 0, 1)$, then the points e, f, g, h, i and j are located on the faces of the trigonal pyramid 1 and have the following coordinate values:

|   | X | Y | Z | W |
|---|---|---|---|---|
| e | 0.65 | 0.35 | 0.00 | 0.00 |
| f | 0.55 | 0.45 | 0.00 | 0.00 |
| g | 0.02 | 0.40 | 0.58 | 0.00 |
| h | 0.02 | 0.50 | 0.48 | 0.00 |
| i | 0.02 | 0.28 | 0.00 | 0.70 |
| j | 0.02 | 0.38 | 0.00 | 0.60 |

In the other words, x, y, z and w are defined as values found in a region drawn as a trigonal prism 3 by linearly connected points e (X=0.65, Y=0.35, Z=0.00, W=0.00), f (X=0.55, Y=0.45, Z=0.00, W=0.00), g(X=0.02, Y=0.40, Z=0.58, W=0.00), h(X=0.02, Y=0.50, Z=0.48, W=0.00), i (X=0.02, Y=0.28, Z=0.00, W=0.70) and j (X=0.20, Y=0.38, Z=0.00, W=0.60), all existing on the faces of the regular trigonal pyramid 1 shown in FIG. 2, the region excluding the line ef. This region exists in a range narrower than the range of the above mentioned region obtained by connecting the points a, b, c and d shown in FIG. 1.

A piezoelectric material containing the composition in which x, y, z and w have values in the region obtained by linearly connecting points e, f, g, h, i and j shown in FIG. 2 has a large electromechanical coupling coefficient ($k_{33}'$).

Figure 3:
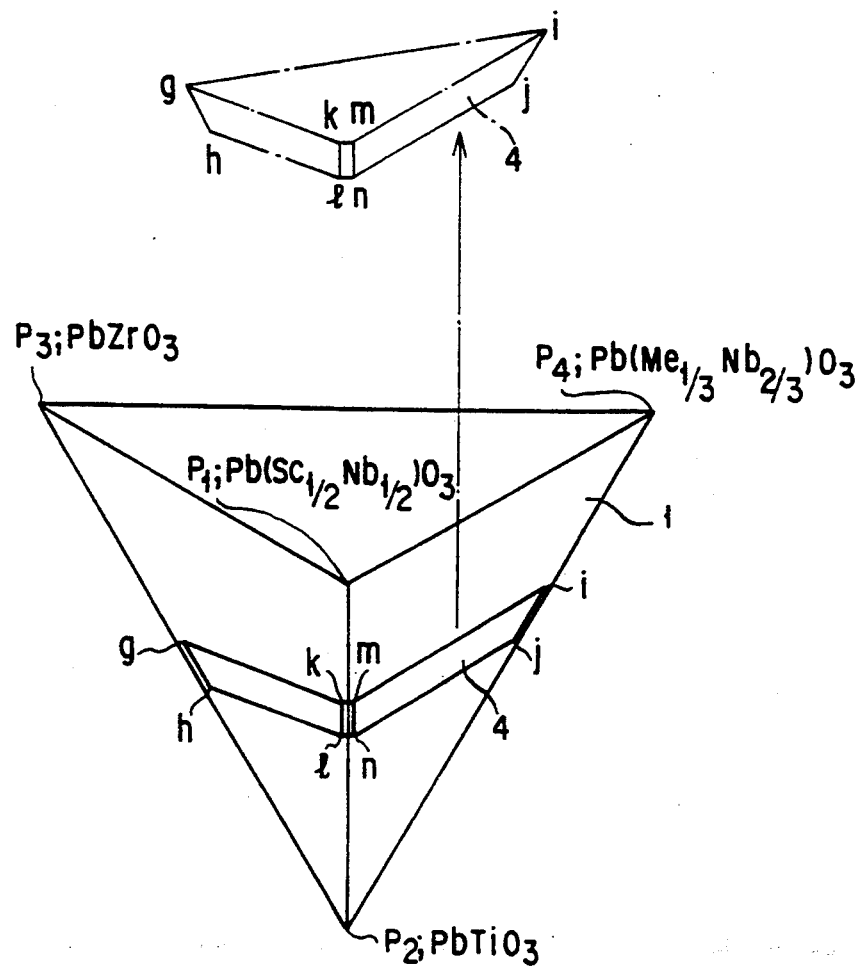
FIG. 3 is a four-element view showing a further narrower composition range of the composition contained in the piezoelectric material according to the present invention.

In the composition contained in the piezoelectric material according to the present invention, as shown in FIG. 3, it is more preferable that x, y, z and w are values following with a region which is defined by connected points g, h, i, j, k, l, m and n. More specifically, as shown in FIG. 3, a regular trigonal pyramid 1 has apices $P_1$, $P_2$, $P_3$ and $P_4$ which correspond to $Pb(Sc_{\frac{1}{2}}Nb_{\frac{1}{2}})O_3$, $PbTiO_3$, $PbZrO_3$ and $Pb(Me_{\frac{1}{2}}Nb_{\frac{2}{3}})O_3$, respectively. Assuming that the apices $P_1$, $P_2$, $P_3$ and $P_4$ have coordinate values of $(X_1, Y_1, Z_1, W_1=1, 0, 0, 0)$, $(X_2, Y_2, Z_2, W_2=0, 1, 0, 0)$, $(X_3, Y_3, Z_3, W_3=0, 0, 1, 0)$ and $(X_4, Y_4, Z_4, W_4=0, 0, 0, 1)$, then the points g, h, i, j, k, l, m and n are located on the faces of the trigonal pyramid 1 and have the following coordinate values:

|   | X | Y | Z | W |
|---|---|---|---|---|
| g | 0.02 | 0.40 | 0.58 | 0.00 |
| h | 0.02 | 0.50 | 0.48 | 0.00 |
| i | 0.02 | 0.28 | 0.00 | 0.70 |
| j | 0.02 | 0.38 | 0.00 | 0.60 |
| k | 0.64 | 0.35 | 0.01 | 0.00 |
| l | 0.54 | 0.45 | 0.01 | 0.00 |
| m | 0.64 | 0.35 | 0.00 | 0.01 |
| n | 0.54 | 0.45 | 0.00 | 0.01 |

In the other words, x, y, z and w are defined as values found in a region drawn as a substantially trigonal prism 4 by connected points g (X=0.02, Y=0.40, Z=0.58, W=0.00), h (X=0.02, Y=0.50, Z=0.48, W=0.00), i (X=0.02, 0.28, Z=0.00, W=0.70), j (X=0.02, Y=0.38, Z=0.00, W=0.60), k (X=0.64, Y=0.35, Z=0.01, W=0.00), 1 (X=0.54, Y=0.45, Z=0.01, W=0.00), m (X=0.64, Y=0.35, Z=0.00, W=0.01) and n (X=0.54, Y=0.35, Z=0.00, W=0.01), all existing on the faces of the regular trigonal pyramid 1 shown in FIG. 3. This region exists in a range narrower than the range of the above mentioned region obtained by connecting the points e, f, g, h, i and j shown in FIG. 2.

A piezoelectric material containing the composition in which x, y, z, and w have values in the region obtained by linearly connecting the points g, h, i, j, k, l, m, and n, i.e. defined by the trigonal prism 4, shown in FIG. 3 has a larger electromechanical coupling coefficient ($k_{33}'$), and its reproducibility also can be improved because the sintering temperature is lowered. In addition, a low manufacturing cost can be realized since it is possible to reduce the amount of scandium oxide which is most expensive in the composition. Furthermore, a pizoelectric material containing the compositions in which x, y, z, and w have values in the region defined by the trigonal prism 4 shown in FIG. 3 is further improved in dielectric constant. This achieves easy impedance matching between an ultrasonic probe including a piezoelectric element composed of the above piezoelectric material and the driving circuit.

The composition ratio of the composition represented by $Pb(Sc_{\frac{1}{2}}Nb_{\frac{1}{2}})O_3$-$PbTiO_3$-$PbZrO_3$-$Pb(Me_{\frac{1}{3}}Nb_{\frac{2}{3}})O_3$, where Me is at least one of Mg, Zn, and Ni, mentioned earlier can be slightly shifted from the stoichiometric ratio. The Me is not limited to one element but may be a combination of two or more elements.

In the composition which is represented by the above formula in which x, y, z, and w have their respective specific values and includes the line ab in FIG. 1, a portion of Pb may be substituted with at least one element selected from the group consisting of Ba, Sr, and Ca. A piezoelectric material containing the composition prepared by substitution of Pb with this kind of a element has a large dielectric constant. If, however, the substitution amount of the metal is too large, the Curie temperature tends to decrease. Therefore, the substitution amount of the element is preferably 25 mol % or less, and more preferably 10 mol % or less.

The composition substituted with the element is preferably contained $Pb(Sc_{\frac{1}{2}}Nb_{\frac{1}{2}})O_3$, $PbTiO_3$ and at least one component selected from the group consistion of $PbZrO_3$ and $Pb(Me_{\frac{1}{3}}Nb_{\frac{2}{3}})O_3$.

In the piezoelectric material according to the present invention, the above composition (including the line ab in FIG. 1) may further contain 0.001 to 3 mol % of at least one oxide selected from the group consisting of $La_2O_3$, $Nb_2O_5$, $Ta_2O_5$, $WO_3$, MnO, and CoO. The addition of such oxide can improve the fracture toughness of the piezoelectric material. In addition, it is possible to obtain a piezoelectric element in which the electromechanical coupling coefficient $k_{33}'$ in the direction of thickness has a value greater than 50% by forming a block composed of the piezoelectric material into a rectangular piezoelectric element.

The content of the above oxide is defined for the reasons explained below. If the content of the oxide is smaller than 0.001 mol %, it becomes difficult to improve the fracture toughness and the electromechanical coupling coefficient. If, on the other hand, the content of the oxide is greater than 3 mol %, the sintering temperature must be raised to make formation of a high-density piezoelectric element difficult. The electromechanical coupling coefficient also decreases. The content of the oxide more preferably ranges between 0.1 and 2 mol %.

The composition added the oxide is preferably contained $Pb(Sc_{\frac{1}{2}}Nb_{\frac{1}{2}})O_3$, $PbTiO_3$ and at least one component selected from the group consisting of $PbZrO_3$ and $Pb(Me_{\frac{1}{3}}Nb_{\frac{2}{3}})O_3$.

The piezoelectric material according to the present invention may contain, e.g., an additive, a substituent, or an impurity, in addition to the above oxide, within a range over which the effect of the present invention is not degraded. More specifically, the piezoelectric material of the present invention may contain a few mol % of a lanthanide element such as $Nd_2O_3$ or $Sm_2O_3$, an additive such as $MoO_6$ or $V_2O_5$, a composite perovskite compound such as $Pb(B1, B2)O_3$ (wherein B1 represents Mg, Zn, Ni, or Fe and B2 represents Ta or W). The additive can also be added in the form of another compound, e.g., $PbNb_2O_6$, $PbTa_2O_6$, or $Pb(Me_{\frac{1}{3}}Nb_{\frac{2}{3}})O_3$. The use of such additive can lower the sintering temperature of the piezoelectric material. In addition, the piezoelectric material may contain 0.1 mol % or less of an impurity such as $Bi_2O_3$, $K_2O$, $Sb_2O_3$, $Cr_2O_3$, or $HfO_2$.

A method of manufacturing the piezoelectric material of the present invention will be described below.

First, substantially equal molar quantities of oxides of Sc and Nb or carbonates, oxalates, hydroxides, and organic compounds of Sc and Nb, which form oxides upon sintering are weighed and sufficiently mixed, and the resultant mixture is milled and calcined at 1,100° to 1,300° C. Subsequently, the obtained calcined product is milled, and the calcined powder is sufficiently mixed with a predetermined amount of an oxide of, e.g., Pb, Ti, Zr, Mg, Ni, Zn, La, Nb, Ta, W, Ba, Sr, Ca, Mn, or Co or a substance which forms an oxide upon sintering, such as a carbonate, an oxalate, a hydroxide, or an organic compound of such a metal. The mixture is milled and calcined at 700° to 900°˜C. In this case, an oxide such as $PbNb_2O_6$, $PbTa_2O_6$, or $Pb(Me_{\frac{1}{3}}Nb_{\frac{2}{3}})O_3$ may be mixed. The addition of such oxide makes it possible to carry out a sintering step (to be described later) at a low temperature.

The above calcined product may also be formed by mixing a predetermined amount of an oxide of, e.g., Sc, Nb, Pb, Ti, Zr, Mg, Ni, Zn, La, Ta, W, Ba, Sr, Ca, Mn, or Co or a substance which forms an oxide upon sintering, such as a carbonate, an oxalate, a hydroxide, or an organic compound of such a metal at one time, milling the mixture, and then calcining the powder.

Subsequently, the calcined product is milled and mixed with an appropriate binder and solvent to cause granulation. The grains are molded into a predetermined shape, and a binder-burn out is performed. The resultant material is sintered to form the piezoelectric material (sintered body) of the present invention.

In the above method, it is possible to obtain a dense sintered body with a theoretical density of 95% or more at a sintering temperature of 1,200° to 1,300° C. The density of the sintered body can be further increased by the use of a hot press or HIP. A piezoelectric vibrator can be manufactured by processing the resultant sintered body into a desired shape, forming electrodes on the obtained piezoelectric element, and performing polarization by applying an electric field of 1 to 3 kv/mm at a temperature of 20° to 200° C.

In the above piezoelectric material manufacturing method, a conventional solid-phase process is used. However, it is also possible to use a chemical synthesis process, such as a sol-gel process, a coprecipitation process, a hydrothermal synthesis process, or an alkoxide process, in the preparation of the powder. In addition, it is also possible to use a thin film process, such as a sputtering process or a chemical vapor deposition process, in the preparation of the ceramic material.

A method of manufacturing a single-crystal piezoelectric material according to the present invention will be described below.

First, a calcined powder is formed in the same fashion as for the ceramic (sintered body) described above. Subsequently, lead oxide (PbO) or boron oxide ($B_2O_3$) serving as a flux is mixed at a predetermined ratio to this calcined powder, and the resultant mixture is placed in a platinum crucible. The mixture in the platinum crucible is heated up to 1,000° to 1,300° C. and held at that temperature for several hours. Thereafter, the mixture is cooled to 850° C. at a rate of 1° to 10° C./hour. The molten mixture in the crucible is then cooled to room temperature and boiled in an aqueous nitric acid solution, thereby extracting a single crystal (piezoelectric material).

The orientation of the single crystal obtained by the above method is determined by using a Laue X-ray apparatus, and the resultant single crystal is formed into a desired shape. Electrodes are formed on the obtained piezoelectric element, and polarization is performed in the same manner as for the above-mentioned sintered body, thereby manufacturing a vibrator.

As the single crystal manufacturing method other than the flux method described above, a Kyropoulos' method, a Czochralski process, a Bridgman technique, a hydrothermal growth process, or a thin film process can be used.

An ultrasonic probe according to an embodiment of the present invention will be described in detail with reference to FIG. 4.

A plurality of piezoelectric elements 11 consisting of piezoelectric material are bonded on a backing member 12 to be separated from each other. The piezoelectric members 11 vibrate in a direction of an arrow A in FIG. 4. A first electrode 13 is formed to extend from the ultrasonic transmitting/receiving surface of the each piezoelectric element 11 to cover its side surface and part of its surface opposite to the transmitting/receiving surface. A second electrode 14 is formed on the other surface of each piezoelectric element 11 opposite to its transmitting/receiving surface to be spaced apart from the corresponding first electrode 13 at a desired distance. Each piezoelectric element 11 and the corresponding first and second electrode 13 and 14 constitute an ultrasonic transmitting/receiving element. Acoustic matching layers 15 are formed on the ultrasonic transmitting/receiving surfaces of the piezoelectric element 11 including the respective first electrodes 13. An acoustic lens 16 is formed to cover the entire portions of the acoustic matching layers 15. A ground electrode plate 17 is connected to the first electrodes 13 by, e.g., soldering. A flexible printed wiring board 18 having a plurality of conductors (cables) is connected to the second electrodes 14, by, e.g., soldering.

Figure 4:
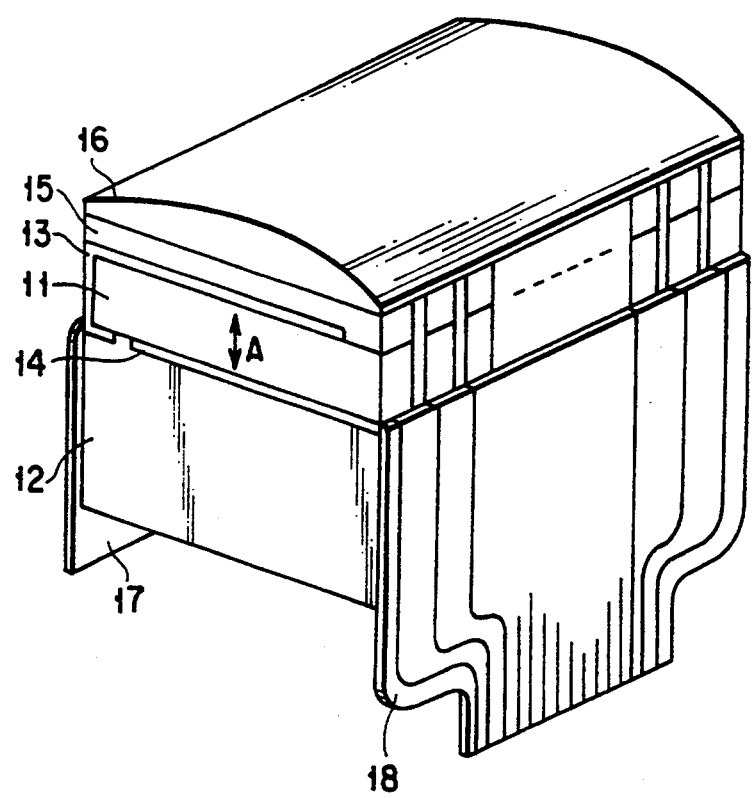
FIG. 4 is a perspective view showing an ultrasonic probe according to the present invention.

The ultrasonic probe having the structure as shown in FIG. 4 is manufactured in accordance with, e.g., the following method.

Conductive films are deposited on the two surfaces of piezoelectric material e.g., plate-like sintered body by sputtering, and selective etching is performed to leave conductive films on the ultrasonic transmitting/receiving surface and the surface opposite to the transmitting/receiving surface of the sintered body. The ground electrode plate 17 is bonded, by soldering, on the end portion of the conductive film located on the transmitting/receiving surface. An acoustic matching layer is formed on the conductive film located on a surface of the sintered body serving as the ultrasonic transmitting/receiving surface. Subsequently, the flexible printed wiring board 18 having the plurality of conductors (cables) is bonded, by soldering, on the end portion of the conductive film located on the surface opposite to the transmitting/receiving surface, and the resultant structure is bonded on the backing member 12. By using a blade, dicing is performed from the acoustic matching layer to the conductive film located on the surface opposite to the transmitting/receiving surface of the sintered body a plurality of times, thus forming the plurality of separated piezoelectric elements 11 respectively having the first and second electrodes 13 and 14 on the backing member 12 and the plurality of acoustic matching layers 15 respectively arranged on the piezoelectric elements 11. The acoustic lens 16 is formed on the acoustic matching layers 15, thus manufacturing an ultrasonic probe.

The piezoelectric element 11 consists of piezoelectric material containing a composition which is represented by $xPb(Sc_{\frac{1}{2}}Nb_{\frac{1}{2}})O_3\text{-}yPbTiO_3\text{-}zPbZrO_3\text{-}wPb(Me_{\frac{1}{3}}Nb_{\frac{2}{3}})O_3$, where Me is at least one metal selected from the group consisting of Mg, Zn and Ni, and $x+y+z+w=1.00$. Here, x, y, z and w are values falling within a region which is defined by connected points a, b, c and d and which excludes alien ab. More specifically, as described above shown in FIG. 1, x, y, z and w are defined as values found in a region drawn as the trigonal pyramid 2 by linearly connected points a (X=0.72, Y=0.28, Z=0.00, W=0.00), b (X=0.02, Y=0.98, Z=0.00, W=0.00), c (X=0.02, Y=0.28, Z=0.70, W=0.00) and d (X=0.02, Y=0.20, Z=0.00, W=0.78), all existing on the faces of the regular trigonal pyramid 1, the region excluding the line ab.

In the composition contained in the piezoelectric material, it is preferable that all of $Pb(Sc_{\frac{1}{2}}Nb_{\frac{1}{2}})O_3$, $PbTiO_3$, $PbZrO_3$ and $Pb(Me_{\frac{1}{3}}Nb_{\frac{2}{3}})O_3$ are contained.

The piezoelectric element 11 more preferably consists of piezoelectric material containing a composition which is represented by the above formula in x, y, z and w are values falling within a region which is defined by connected points e, f, g, h, i and j and excludes a lien ef. More specifically, as described above shown in FIG. 2, x, y, z and w are defined as values found in a region drawn as the trigonal prism 3 by linearly connected points e (X=0.65, Y=0.35, Z=0.00, W=0.00), f ( X=0.55, Y=0.45, Z=0.00, W=0.00), g ( X=0.02, Y=0.40, Z=0.58, W=0.00), h (X=0.02, Y=0.50, Z=0.48, W=0.00), i (X=0.02, Y=0.28, Z=0.00, W=0.70) and j (X=0.02, Y=0.38, Z=0.00, W=0.60), all existing on the faces of the regular trigonal pyramid 1, said region excluding the line ef.

The piezoelectric element 11 most preferably consists of piezoelectric material containing a composition which is represented by the above formula in x, y, z and w are values falling within a region which is defined by connected points g, h, i, j, k, l, m and n. More specifically, as described above shown in FIG. 3, x, y, z and w are defined as values found in a region drawn as a substantially trigonal prism 4 by linearly connected points g (X=0.02, Y=0.40, Z=0.58, W=0.00), h (X=0.02, Y=0.05, Z=0.48, W=0.00), i (X=0.02, Y=0.28, Z=0.00, W=0.70), j (X=0.02, Y=0.38, Z=0.00, W=0.60), k (X=0.64, Y=0.35, Z=0.00, W=0.01), l (X=0.54, Y=0.45, Z=0.01, W=0.00), m (X=0.64, Y=0.35, Z=0.00, W=0.01) and n (X=0.54, Y=0.45, Z=0.00, W=0.01), all existing on the faces of the regular trigonal pyramid 1.

The piezoelectric element 11 may consist of a piezoelectric material containing a composition (including the line ab in FIG. 1) in which a portion of Pb in the above formula is substituted with at least one element selected from the group consisting of Ba, Sr, and Ca, and x, y, z, and w have the specific values described above. The substitution amount of the element is preferably 25 mol % or less for the same reason as for the piezoelectric material mentioned earlier.

The composition substituted with the element is preferably contained $Pb(Sc_{\frac{1}{2}}Nb_{\frac{1}{2}})O_3$, $PbTiO_3$ and at least one component selected from the group consisting of $PbZrO_3$ and $Pb(Me_{\frac{1}{3}}Nb_{\frac{2}{3}})O_3$.

The piezoelectric element 11 may consist of a piezoelectric material in which the composition (including the line ab in FIG. 1) further contains 0.001 to 3 mol % of at least one oxide selected from the group consisting of $La_2O_3$, $Nb_2O_5$, $Ta_2O_5$, $WO_3$, MnO, and CoO. The content of the oxide is defined for the same reason as for the piezoelectric material described above.

The composition added the oxide is preferably contained $Pb(Sc_{\frac{1}{2}}Nb_{\frac{1}{2}})O_3$, $PbTiO_3$ and at least one component selected from the group consisting of $PbZrO_3$ and $Pb(Me_{\frac{1}{3}}Nb_{\frac{2}{3}})O_3$.

The width of the piezoelectric element 11 is preferably 100 μm or smaller.

The first and second electrodes 13 and 14 are made of a two-layered metal film, e.g., a Ti/Au film, an Ni/Au film, or a Cr/Au film.

An ultrasonic probe according to the present invention includes a piezoelectric element consisting of a piezoelectric material containing a composition which is represented by $xPb(Sc_{\frac{1}{2}}Nb_{\frac{1}{2}})O_3$-$yPbTiO_3$-$zPbZrO_3$-$wPb(Me_{\frac{1}{3}}Nb_{\frac{2}{3}})O_3$ wherein Me represents at least one metal selected from the group consisting of Mg, Zn, and Ni, and x+y+z+w=1.00. Here, values of x, y, z and w are within the region defined by the trigonal pyramid 2 shown in FIG. 1, but not including the line ab. The piezoelectric material containing this composition has a high fracture toughness and a large electromechanical coupling coefficient ($k_{33}'$). Therefore, since the ultrasonic probe including the piezoelectric element consisting of this piezoelectric material can prevent occurrence of cracks over long periods of time, a long operating life can be achieved.

In addition, it is possible to prevent occurrence of cracks in cutting the piezoelectric material (e.g., a sintered body) into rectangular piezoelectric element by using a dicer. Consequently, a piezoelectric element with a very small width of 100 μm or smaller can be formed. This can realize an ultrasonic probe with an ultrasonic radiating surface which is small in diameter even when a plurality of arrays of the above piezoelectric elements are incorporated into the probe. The ultrasonic probe with this arrangement can radiate an ultrasonic wave onto a very small portion of a human body to allow high-resolution diagnosis of that portion of the living body.

Furthermore, since the piezoelectric element has a high fracture toughness, high voltages can be applied to the piezoelectric element without causing cracks. As a result, it is possible to realize an ultrasonic probe which radiates an ultrasonic wave with a very high impact force in combination with the large electromechanical coupling coefficient ($k_{33}'$) of the piezoelectric element. The ultrasonic probe of this type can be effectively used in a lithotrity apparatus.

The present invention will be described in greater detail below by way of its preferred examples.

Examples 1–47

Equal molar quantities of $Sc_2O_3$ and $Nb_2O_5$ with a purity of 99.9% or higher were milled and mixed in a 0.7-l polyethylene pot by using zirconia balls 5 mm in diameter and pure water, and the resultant mixture was dried and calcined at 1,200° C. for four hours. The obtained calcined product was again milled in the pot to prepare a submicron-size $ScNbO_4$ powder.

Likewise, equal molar quantities of each of MgO, ZnO, and NiO, and $Nb_2O_5$ with a purity of 99.9% or higher were weighed into a 0.7-l polyethylene pot and milled and mixed by using zirconia balls with a diameter of 5 mm and pure water. The resultant mixtures were dried and calcined at 1,150° C. for four hours. The obtained calcined products were again milled in the pot to prepare submicron-size powders of $MgNb_2O_6$, $NiNb_2O_6$, and $ZnNb_2O_6$.

Subsequently, the above $ScNbO_4$ powder, the powders of $MgNb_2O_6$, $NiNb_2O_6$, and $ZnNb_2O_6$, PbO, $TiO_2$, $ZrO_2$, $BaCO_3$, $SrCO_3$, and $CaCO_3$ with a purity of 99.5% or higher, and additives listed in Tables 1 to 5 were so weighed as to obtain compositions listed in Tables 1 to 5. These materials were milled and mixed in a pot mill by using zirconia balls 5 mm in diameter and pure water, and the resultant mixtures were dried and calcined at 800° C. for two hours. Each resultant calcined product was again milled in the pot to prepare a submicron-size powder. Subsequently, each powder was added and mixed with 7 wt % of an aqueous polyvinyl alcohol solution with a concentration of 5 wt % in a mortar, and the mixture was granulated by using a #32 screen.

Each granulated powder was then molded into a shape 19 mm in diameter and 2 mm in thickness at a pressure of 1 ton/cm², and the binder-burn out was performed at 500° C. Thereafter, these molded products were sintered in a sagger consisting of high-density magnesia at temperatures shown in Tables 1 to 5 below for three hours, thereby manufacturing 47 types of disklike sintered bodies as piezoelectric materials.

The apparent specific gravity of each disk-like sintered body was measured. Further, the lattice constant of the body was measured by x-ray refraction analysis. The ratio between the lattice constant thus measured and the lattice constant obtained by the sintered body having the theoretical density was applied to the apparent specific gravity, thereby obtaining the density ratio of the sintered body. The sintering densities of all of the sintered bodies were 95% or higher of the theoretical density.

A disk-like sample with a diameter of 16 mm and a thickness of 1 mm and a square-bar sample with a 1 mm×1 mm×4 mm were formed from each disk-like sintered body. Silver electrodes were baked on opposing surfaces of each sample at 700° C., and polarization was performed for the sample in silicone oil while an electric field of 25 kV/mm at a temperature of 120° C. was applied and the temperature was decreased to 25° C. After 24 hours aging at room temperature, the dielectric constant, the electromechanical coupling coefficient $k_p$ in the radial direction, and the electromechanical coupling coefficient $k_{33}$ in the direction of length of each sample were measured. In addition, each disk-like sintered body was formed into a sample with a diameter of 16 mm and a thickness of 400 μm. Silver electrodes were baked on both the surfaces of each sample, and polarization was performed in the same fashion as described above. Thereafter, resultant sample was cut out by using dicing machine with diamond blade of 20 μm thickness to obtain a rectangular sample 200 μm in width, 400 μm in thickness, and 10 mm in length, and a rectangular sample 100 μm in width, 400 μm in thickness, and 10 mm in length, and the electromechanical coupling coefficient $k_{33}'$ in the direction of thickness of each sample was measured. Note that the electromechanical coupling coefficients $k_p$, $k_{33}$, and $k_{33}'$ were obtained by using a resonance-antiresonance method in accordance with the following equations. The results are summarized in Tables 1 to 5 below.

$$\frac{1}{k_p^2} = 0.395 \frac{fr}{\Delta f} + 0.574$$

$$\frac{1}{k_{33}^2} = 0.405 \frac{fr}{\Delta f} + 0.810$$

$$\frac{1}{k_{33}'^2} = 0.405 \frac{fr}{\Delta f} + 0.810$$

(where fr is the resonant frequency and Δf is the antiresonant frequency—resonant frequency.)

Each of the above disk-like sintered body was used to manufacture the array-type ultrasonic probe shown in FIG. 4 mentioned earlier. That is, each disk-like sintered body was formed into a square plate 10 mm in width, 15 mm in length, and 400 μm in thickness. A Ti/Au conductive film was vapor-deposited on the upper and lower surfaces and the side surfaces of the square plate by sputtering. Thereafter, a selective etching technique was used to remove the conductive film on one side surface and a portion of the conductive film on a surface opposite to a surface serving as an ultrasonic transmitting/receiving surface. Subsequently, an acoustic matching layer was formed on the surface of the square plate serving as the ultrasonic transmitting-/receiving surface, and a flexible printed wiring board 18 was connected to the conductive film serving as first electrodes by soldering. In addition, a ground electrode plate 17 was connected to the conductive film serving as second electrodes by soldering, and the resultant structure was bonded to a backing member 12. Note that the flexible printed wiring board 18 and the ground electrode plate 17 were connected to the conductive films by conductive paste, respectively. The obtained structure was then cut from the acoustic matching layer to the square plate into 100 μm wide rectangular members by using a diamond blade, thereby forming 100 piezoelectric elements 11 which were 100 μm wide, 10 mm long, and 400 μm thick separated from each other and each having first and second electrodes 13 and 14 on the backing member 12, and forming a plurality of acoustic matching layers 15 respectively formed on the piezoelectric elements 11. Subsequently, an acoustic lens 16 was formed on the acoustic matching layers 15, and a plurality of 110 pF/m, 2 m long cables (not shown) were connected to the flexible printed wiring board 18 and the ground electrode plate 17, respectively thereby manufacturing the array-type ultrasonic probe.

The capacitance of each array-type ultrasonic probe was measured by applying a voltage between the first and second electrodes of probe, and counting those of 100 vibrators which had a capacitance less than the reference value which each vibrator would have if none of the piezoelectric elements had not been cracked. The results are shown in Tables 1 to 5 below. Note that the capacitance measurement was performed for each probe not connected to the cables.

Each ultrasonic probe subjected to the above capacitance measurement was disassembled, and the number of cracks of the 100 piezoelectric elements removed was counted by observing the upper and side surfaces of the piezoelectric elements by using a microscope. The results are also shown in Tables 1 to 5.

TABLE 1

| Example | x*1 (mol) | y*1 (mol) | z*1 (mol) | w*1 (mol) | Me*2 element | Additive | Content of additive (mol %) | Substitution component of Pb | Substituon amount (mol %) | Sintering temperature (°C.) |
|---|---|---|---|---|---|---|---|---|---|---|
| 1 | 0.02 | 0.98 | 0.00 | 0.00 | — | Ta$_2$O$_5$ | 0.05 | Ca | 25 | 1250 |
| 2 | 0.10 | 0.90 | 0.00 | 0.00 | — | Ta$_2$O$_5$ | 0.01 | Ca | 20 | 1225 |
| 3 | 0.20 | 0.80 | 0.00 | 0.00 | — | WO$_3$ | 1.0 | — | — | 1225 |
| 4 | 0.30 | 0.70 | 0.00 | 0.00 | — | WO$_3$ | 1.0 | — | — | 1225 |
| 5 | 0.40 | 0.60 | 0.00 | 0.00 | — | Nb$_2$O$_5$ | 0.01 | — | — | 1250 |
| 6 | 0.50 | 0.50 | 0.00 | 0.00 | — | Nb$_2$O$_5$ | 0.5 | — | — | 1250 |
| 7 | 0.54 | 0.46 | 0.00 | 0.00 | — | Nb$_2$O$_5$ | 1.0 | — | — | 1275 |
| 8 | 0.55 | 0.45 | 0.00 | 0.00 | — | Nb$_2$O$_5$ | 1.0 | — | — | 1275 |
| 9 | 0.57 | 0.43 | 0.00 | 0.00 | — | Nb$_2$O$_5$ | 1.0 | — | — | 1275 |
| 10 | 0.60 | 0.40 | 0.00 | 0.00 | — | Nb$_2$O$_5$ | 2.0 | — | — | 1275 |

| Example | Dielectric constant | Kp (%) | k33 (%) | k33' for width of 200 μm (%) | k33' for width of 100 μm (%) | Number of vibrators having a capacitance less than reference value | Number of cracks in 100 μm-wide piezoelectric elements |
|---|---|---|---|---|---|---|---|
| 1 | 200 | 5 | 54 | 53 | 51 | 1/100 | 1/100 |
| 2 | 220 | 10 | 53 | 53 | 51 | 1/100 | 1/100 |
| 3 | 400 | 20 | 55 | 55 | 53 | 0/100 | 0/100 |
| 4 | 600 | 28 | 55 | 53 | 51 | 0/100 | 0/100 |
| 5 | 1000 | 35 | 56 | 52 | 50 | 0/100 | 0/100 |
| 6 | 1200 | 40 | 53 | 50 | 50 | 0/100 | 0/100 |
| 7 | 1800 | 50 | 58 | 59 | 50 | 0/100 | 0/100 |

TABLE 1-continued

| | | | | | | | |
|---|---|---|---|---|---|---|---|
| 8 | 2200 | 53 | 61 | 60 | 60 | 0/100 | 0/100 |
| 9 | 3200 | 70 | 79 | 72 | 70 | 0/100 | 0/100 |
| 10 | 1200 | 61 | 73 | 63 | 61 | 0/100 | 0/100 |

[1]; x, y, z, and w represent $Pb(Sc_{\frac{1}{2}}Nb_{\frac{1}{2}})O_3$, $PbTiO_3$, $PbZrO_3$, and $Pb(Me_{\frac{1}{3}}Nb_{\frac{2}{3}})O_3$, respectively.
[2]; Me element for $(Pb(Me_{\frac{1}{3}}Nb_{\frac{2}{3}})O_3)$.

TABLE 2

| Example | x[1] (mol) | y[1] (mol) | z[1] (mol) | w[1] (mol) | Me[2] element | Additive | Content of additive (mol %) | Substitution component of Pb | Substituon amount (mol %) | Sintering temperature (°C.) |
|---|---|---|---|---|---|---|---|---|---|---|
| 11 | 0.65 | 0.35 | 0.00 | 0.00 | — | — | — | Ba | 4 | 1275 |
| 12 | 0.72 | 0.28 | 0.00 | 0.00 | — | $Nb_2O_5$ | 3.0 | — | — | 1300 |
| 13 | 0.57 | 0.42 | 0.01 | 0.00 | — | $Nb_2O_5$ | 1.0 | Sr | 2 | 1275 |
| 14 | 0.47 | 0.43 | 0.10 | 0.00 | — | $Nb_2O_5$ | 1.0 | — | — | 1250 |
| 15 | 0.36 | 0.44 | 0.20 | 0.00 | — | $PbNb_2O_6$ | 0.5 | — | — | 1225 |
| 16 | 0.25 | 0.45 | 0.30 | 0.00 | — | $Nb_2O_5$ | 0.5 | — | — | 1250 |
| 17 | 0.14 | 0.46 | 0.40 | 0.00 | — | $Nb_2O_5$ | 3.0 | — | — | 1275 |
| 18 | 0.10 | 0.44 | 0.46 | 0.00 | — | $La_2O_3$ | 1.0 | Sr | 10 | 1250 |
| 19 | 0.04 | 0.47 | 0.49 | 0.00 | — | $WO_3$ | 1.0 | — | — | 1225 |
| 20 | 0.04 | 0.46 | 0.50 | 0.00 | — | $Ta_2O_5$ | 2.0 | Ba | 5 | 1300 |

| Example | Dielectric constant | Kp (%) | k33 (%) | k33' for width of 200 μm (%) | k33' for width of 100 μm (%) | Number of vibrators having a capacitance less than reference value | Number of cracks in 100 μm-wide piezoelectric elements |
|---|---|---|---|---|---|---|---|
| 11 | 1400 | 55 | 66 | 62 | 60 | 0/100 | 0/100 |
| 12 | 1000 | 45 | 51 | 50 | 49 | 1/100 | 1/100 |
| 13 | 3000 | 70 | 80 | 72 | 70 | 1/100 | 1/100 |
| 14 | 2800 | 70 | 80 | 71 | 71 | 0/100 | 0/100 |
| 15 | 2600 | 68 | 78 | 71 | 70 | 0/100 | 0/100 |
| 16 | 2400 | 69 | 76 | 71 | 70 | 0/100 | 0/100 |
| 17 | 2000 | 68 | 77 | 70 | 69 | 2/100 | 1/100 |
| 18 | 3500 | 65 | 74 | 68 | 68 | 0/100 | 0/100 |
| 19 | 2000 | 65 | 73 | 70 | 69 | 0/100 | 0/100 |
| 20 | 1500 | 66 | 73 | 69 | 61 | 0/100 | 0/100 |

[1] x, y, z, and w represent $Pb(Sc_{\frac{1}{2}}Nb_{\frac{1}{2}})O_3$, $PbTiO_3$, $PbZrO_3$, and $Pb(Me_{\frac{1}{3}}Nb_{\frac{2}{3}})O_3$, respectively.
[2]; Me element for $(Pb(Me_{\frac{1}{3}}Nb_{\frac{2}{3}})O_3)$.

TABLE 3

| Example | x[1] (mol) | y[1] (mol) | z[1] (mol) | w[1] (mol) | Me[2] element | Additive | Content of additive (mol %) | Substitution component of Pb | Substituon amount (mol %) | Sintering temperature (°C.) |
|---|---|---|---|---|---|---|---|---|---|---|
| 21 | 0.02 | 0.28 | 0.70 | 0.00 | — | $Nb_2O_5$ | 1.0 | Ba, Sr | 10,5 | 1250 |
| 22 | 0.02 | 0.40 | 0.58 | 0.00 | — | — | — | Sr | 10 | 1250 |
| 23 | 0.02 | 0.50 | 0.48 | 0.00 | — | — | — | Sr | 1 | 1225 |
| 24 | 0.02 | 0.20 | 0.00 | 0.78 | Zn | — | — | Ba | 5 | 1200 |
| 25 | 0.02 | 0.28 | 0.00 | 0.70 | Mg | — | — | — | — | 1225 |
| 26 | 0.02 | 0.38 | 0.00 | 0.60 | Ni | — | — | Ba | 1 | 1225 |
| 27 | 0.02 | 0.96 | 0.00 | 0.02 | Mg | MnO | 1.0 | Ca | 25 | 1250 |
| 28 | 0.05 | 0.34 | 0.00 | 0.61 | Mg | $Nb_2O_5$ | 1.0 | — | — | 1275 |
| 29 | 0.10 | 0.35 | 0.00 | 0.55 | Mg | — | — | Sr | 1 | 1275 |
| 30 | 0.10 | 0.70 | 0.00 | 0.20 | Ni | — | — | Ba | 5 | 1250 |

| Example | Dielectric constant | Kp (%) | k33 (%) | k33' for width of 200 μm (%) | k33' for width of 100 μm (%) | Number of vibrators having a capacitance less than reference value | Number of cracks in 100 μm-wide piezoelectric elements |
|---|---|---|---|---|---|---|---|
| 21 | 800 | 40 | 57 | 51 | 50 | 0/100 | 0/100 |
| 22 | 2000 | 58 | 68 | 63 | 60 | 2/100 | 1/100 |
| 23 | 1100 | 58 | 69 | 64 | 63 | 1/100 | 1/100 |
| 24 | 2800 | 49 | 55 | 54 | 52 | 1/100 | 1/100 |
| 25 | 2500 | 57 | 67 | 63 | 61 | 0/100 | 0/100 |
| 26 | 2300 | 55 | 65 | 62 | 60 | 0/100 | 0/100 |
| 27 | 215 | 5 | 52 | 51 | 51 | 2/100 | 2/100 |
| 28 | 4200 | 66 | 74 | 68 | 68 | 0/100 | 0/100 |
| 29 | 4400 | 66 | 73 | 67 | 65 | 0/100 | 0/100 |
| 30 | 350 | 11 | 54 | 53 | 52 | 2/100 | 1/100 |

[1] x, y, z, and w represent $Pb(Sc_{\frac{1}{2}}Nb_{\frac{1}{2}})O_3$, $PbTiO_3$, $PbZrO_3$, and $Pb(Me_{\frac{1}{3}}Nb_{\frac{2}{3}})O_3$, respectively.
[2]; Me element for $(Pb(Me_{\frac{1}{3}}Nb_{\frac{2}{3}})O_3)$.

TABLE 4

| | | Content | Sub- | Sub- | Sintering |

TABLE 4-continued

| Example | $x^{*1}$ (mol) | $y^{*1}$ (mol) | $z^{*1}$ (mol) | $w^{*1}$ (mol) | $Me^{*2}$ element | Additive | Content of additive (mol %) | Substitution component of Pb | Substituon amount (mol %) | Sintering temperature (°C.) |
|---|---|---|---|---|---|---|---|---|---|---|
| 31 | 0.20 | 0.37 | 0.00 | 0.43 | Mg | $Ta_2O_5$ | 0.05 | — | — | 1250 |
| 32 | 0.30 | 0.26 | 0.00 | 0.44 | Zn | $La_2O_3$ | 0.2 | — | — | 1250 |
| 33 | 0.40 | 0.20 | 0.00 | 0.20 | Ni | $Nb_2O_5$ | 0.5 | Sr | 1 | 1275 |
|    |      |      |      | 0.20 | Mg |          |     |    |   |      |
| 34 | 0.50 | 0.42 | 0.00 | 0.08 | Mg | CoO | 0.5 | — | — | 1275 |
| 35 | 0.55 | 0.44 | 0.00 | 0.01 | Mg | $Nb_2O_5$ | 1.0 | — | — | 1275 |
| 36 | 0.60 | 0.48 | 0.00 | 0.02 | Zn | — | — | Sr | 10 | 1275 |
| 37 | 0.65 | 0.34 | 0.00 | 0.01 | Mg | — | — | — | — | 1275 |
| 38 | 0.72 | 0.27 | 0.00 | 0.01 | Zn | $Ta_2O_5$ | 0.5 | — | — | 1300 |
| 39 | 0.30 | 0.38 | 0.00 | 0.32 | Mg | — | — | — | — | 1275 |
| 40 | 0.42 | 0.33 | 0.00 | 0.25 | Zn | MnO | 0.05 | — | — | 1225 |

| Example | Dielectric constant | Kp (%) | k33 (%) | k33' for width of 200 μm (%) | k33' for width of 100 μm (%) | Number of vibrators having a capacitance less than reference value | Number of cracks in 100 μm-wide piezoelectric elements |
|---|---|---|---|---|---|---|---|
| 31 | 4000 | 67 | 75 | 69 | 68 | 0/100 | 0/100 |
| 32 | 3600 | 68 | 76 | 69 | 68 | 0/100 | 0/100 |
| 33 | 3400 | 69 | 75 | 69 | 68 | 0/100 | 0/100 |
| 34 | 2900 | 67 | 74 | 68 | 68 | 0/100 | 0/100 |
| 35 | 2500 | 69 | 77 | 71 | 70 | 0/100 | 0/100 |
| 36 | 4000 | 68 | 75 | 69 | 68 | 0/100 | 0/100 |
| 37 | 1300 | 57 | 67 | 61 | 60 | 0/100 | 0/100 |
| 38 | 1050 | 46 | 52 | 50 | 50 | 0/100 | 0/100 |
| 39 | 3000 | — | — | 72 | 70 | 0/100 | 0/100 |
| 40 | 3300 | 69 | 76 | 70 | 70 | 0/100 | 0/100 |

*1 x, y, z, and w represent $Pb(Sc_{\frac{1}{2}}Nb_{\frac{1}{2}})O_3$, $PbTiO_3$, $PbZrO_3$, and $Pb(Me_{\frac{1}{3}}Nb_{\frac{2}{3}})O_3$, respectively.
*2; Me element for $(Pb(Me_{\frac{1}{3}}Nb_{\frac{2}{3}})O_3)$.

TABLE 5

| Example | $x^{*1}$ (mol) | $y^{*1}$ (mol) | $z^{*1}$ (mol) | $w^{*1}$ (mol) | $Me^{*2}$ element | Additive | Content of additive (mol %) | Substitution component of Pb | Substituon amount (mol %) | Sintering temperature (°C.) |
|---|---|---|---|---|---|---|---|---|---|---|
| 41 | 0.02 | 0.94 | 0.02 | 0.02 | Mg | MnO | 1 | Ca | 20 | 1250 |
| 42 | 0.04 | 0.90 | 0.04 | 0.02 | Zn | — | — | Ca | 25 | 1250 |
| 43 | 0.04 | 0.40 | 0.24 | 0.32 | Ni | — | — | — | — | 1250 |
| 44 | 0.18 | 0.42 | 0.19 | 0.21 | Zn | — | — | Sr | 1 | 1225 |
| 45 | 0.30 | 0.36 | 0.12 | 0.22 | Mg | — | — | — | — | 1225 |
| 46 | 0.40 | 0.42 | 0.08 | 0.10 | Mg | MnO | 0.001 | — | — | 1250 |
| 47 | 0.54 | 0.42 | 0.02 | 0.02 | Mg | $Nb_2O_5$ | 0.5 | — | — | 1250 |

| Example | Dielectric constant | Kp (%) | k33 (%) | k33' for width of 200 μm (%) | k33' for width of 100 μm (%) | Number of vibrators having a capacitance less than reference value | Number of cracks in 100 μm-wide piezoelectric elements |
|---|---|---|---|---|---|---|---|
| 41 | 195 | 6 | 55 | 53 | 52 | 2/100 | 2/100 |
| 42 | 225 | 5 | 55 | 54 | 51 | 1/100 | 1/100 |
| 43 | 3100 | 69 | 76 | 71 | 69 | 0/100 | 0/100 |
| 44 | 2700 | 69 | 75 | 71 | 69 | 0/100 | 0/100 |
| 45 | 2600 | 68 | 75 | 70 | 69 | 0/100 | 0/100 |
| 46 | 2400 | 69 | 77 | 72 | 72 | 0/100 | 0/100 |
| 47 | 2100 | 72 | 79 | 72 | 71 | 0/100 | 0/100 |

*1 x, y, z, and w represent $Pb(Sc_{\frac{1}{2}}Nb_{\frac{1}{2}})O_3$, $PbTiO_3$, $PbZrO_3$, and $Pb(Me_{\frac{1}{3}}Nb_{\frac{2}{3}})O_3$, respectively.
*2; Me element for $(Pb(Me_{\frac{1}{3}}Nb_{\frac{2}{3}})O_3)$.

Examples 48–50

An $ScNbO_4$ powder and powders of $MgNb_2O_6$ and $ZnNb_2O_6$ were prepared following the same procedures as in Example 1. These powders, PbO and $TiO_2$ with a purity of 99.9% or higher, and additives listed in Table 6 were so weighed as to obtain compositions listed in Table 6. These materials were then milled and mixed in a pot mill by using zirconia balls 5 mm in diameter and pure water, and the resultant mixtures were dried and calcined at 800° C. for two hours. Each resultant calcined product was again milled in the pot to form a powder.

Each calcined powder and lead oxide were mixed at a mol ratio of 1:3, and a 1 kg portion of the mixture was placed in a 200 ml platinum crucible, and the crucible was sealed with a platinum cover. Subsequently, each crucible was placed in an electric oven and heated up to 1,280° C. at a rate of 100° C./hour. After this condition was held for six hours, oxygen was introduced to the lower portion of each crucible, and the flow rate of oxygen was controlled such that the temperature in the bottom portion was lower by 20° C. or more than that in the upper portion. Subsequently, each crucible was cooled to 850° C. at a rate of 1°° C./hour and then to room temperature. The resultant materials were boiled in a 20% aqueous nitric acid solution to extract three types of single crystals as piezoelectric materials. Each single crystal was a square plate of 10 mm side.

The orientation of each single crystal was set at [100], and the resultant single crystal was formed into square plate samples which were 8 mm wide, 8 mm long, and 400 μm thick, respectively. Silver electrodes were baked on opposing surfaces of each sample at 700° C., and polarization was performed for the sample in silicone oil while an electric field of 120° C.×15 kv/mm was applied and the temperature was decreased to 25° C. After 24 hours elapsed at room temperature, the dielectric constant, of each sample was measured. In addition, a rectangular sample 200 μm in width, 400 μm in thickness, and 6 mm in length, and a rectangular sample 100 μm in width, 400 μm in thickness, and 6 mm in length were cut out from each single crystal by using a dicing machine having a blade of 20 μm in thickness, and the electromechanical coupling coefficient $k_{33}'$ in the direction of thickness of each sample was measured by using the resonance-antiresonance method like in Example 1. The results are summarized in Table 6 below.

Each of the above single crystal was used to manufacture the array-type ultrasonic probe shown in FIG. 4 mentioned earlier following the same procedures as in Example 1. Note that a square plate was formed by setting the orientation of each single crystal at [100] and polishing the resultant single crystal to have a thickness of 400 μm. Each resultant structure was cut from the acoustic matching layer to the square plate by using a diamond blade, thereby forming 30 rectangular piezoelectric elements of 100 μm in width.

The capacitance of each array-type ultrasonic probe was measured by applying a voltage between the first and second electrodes of probe., and counting those of 30 vibrators which had a capacitance less than the reference value which each vibrator would have if none of the piezoelectric elements had not been cracked. Note that the capacitance measurement was performed for each probe not connected to the cables described above. As a result, none of the vibrators had their capacitance reduced.

Each ultrasonic probe subjected to the above capacitance measurement was disassembled, and the number of cracks of the 30 piezoelectric elements removed was counted by observing the upper and side surfaces of the piezoelectric elements by using a microscope. The result is also shown in Table 6.

Comparative Examples 1–11

An $ScNbO_4$ powder formed following the same procedures as in Example 1, PbO, $TiO_2$, $ZrO_2$, and $SrCO_3$ with a purity of 99.5% or higher, and additives listed in Table 7 below were so weighed as to obtain compositions listed in Table 7. These materials were milled and mixed in a pot mill by using zirconia balls 5 mm in diameter and pure water, and the resultant mixtures were dried and calcined at 800° C. for two hours. Each resultant calcined product was again milled in the pot to prepare a submicron-size powder. Subsequently, each powder was added and mixed with 7 wt % of an aqueous polyvinyl alcohol solution with a concentration of 5 wt % in a mortar, and the mixture was granulated by using a #32 screen.

Each granulated powder was then molded into a shape 19 mm in diameter and 2 mm in thickness at a pressure of 1 ton/cm², and the binder-burn out was performed at 500° C. Thereafter, these molded products were sintered in a sagger consisting of high-density magnesia at temperatures shown in Table 7 below for three hours, thereby manufacturing 11 types of disk-like sintered bodies as piezoelectric materials.

The apparent specific gravity of each disk-like sintered body was measured. Further, the lattice constant of the body was measured by x-ray refraction analysis. The ratio between the lattice constant thus measured and the lattice constant obtained by the sintered body having theoretical density was applied to the apparent specific gravity, thereby obtaining the density ratio of the sintered body. The sintering densities of the sintered bodies except for those of Comparative Examples 1 and 11 were 90% or higher of the theoretical density.

A disk-like sample with a diameter of 16 mm and a thickness of 1 mm and a square-bar sample with a 1 mm×1 mm×4 mm were formed from each disk-like sintered body (except for those of Comparative Examples 1 and 11). Silver electrodes were baked on opposing surfaces of each sample at 700° C., and polarization was performed for the sample in silicone oil while an electric field of 120° C.×25 kv/mm was applied and the temperature was decreased to 25° C. After 24 hours aging at room temperature, the dielectric constant, the electromechanical coupling coefficient $k_p$ in the radial direction, and the electromechanical coupling coefficient $k_{33}$ in the longitudinal direction of each sample were measured by using the resonance-antiresonance method

TABLE 6

| Example | $x^{*1}$ (mol) | $y^{*1}$ (mol) | $z^{*1}$ (mol) | $w^{*1}$ (mol) | $Me^{*2}$ element | Additive | Content of additive (mol %) | Substitution component of Pb | Substituon amount (mol %) |
|---|---|---|---|---|---|---|---|---|---|
| 48 | 0.30 | 0.38 | 0.00 | 0.32 | Mg | — | — | — | — |
| 49 | 0.42 | 0.33 | 0.00 | 0.25 | Zn | MnO | 0.05 | — | — |
| 50 | 0.10 | 0.35 | 0.00 | 0.55 | Mg | — | — | Sr | 1 |

| Example | Form | Dielectric constant | $k_{33}'$ for width of 200 μm (%) | $k_{33}'$ for width of 100 μm (%) | Number of cracks in 100 μm-wide piezoelectric elements |
|---|---|---|---|---|---|
| 48 | Single crystal | 1800 | 84 | 83 | 0/30 |
| 49 | Single crystal | 1900 | 82 | 82 | 0/30 |
| 50 | Single crystal | 2800 | 83 | 82 | 0/30 |

*1; x, y, z, and w represent $Pb(Sc_{\frac{1}{2}}Nb_{\frac{1}{2}})O_3$, $PbTiO_3$, $PbZrO_3$, and $Pb(Me_{\frac{1}{3}}Nb_{\frac{2}{3}})O_3$, respectively.
*2; Me element for $(Pb(Me_{\frac{1}{3}}Nb_{\frac{2}{3}})O_3)$.

like in Example 1. In addition, each disk-like sintered body (except for those of Comparative Examples 1 and 11) was formed into a sample with a diameter of 16 mm and a thickness of 400 μm. Silver electrodes were baked on both the surfaces of each sample, and polarization was performed in the same fashion as described above. Thereafter, a rectangular sample 200 μm in width, 400 μm in thickness, and 10 mm in length, and a rectangular sample 100 μm in width, 400 μm in thickness, and 10 mm in length were cut out from the resultant sample by using a dicing machine, and the electromechanical coupling coefficient $k_{33'}$, in the direction of thickness of each sample was measured by using the resonance-antiresonance method like in Example 1. The results are summarized in Table 7 below.

Each of the above disk-like sintered body was used to manufacture the array-type ultrasonic probe shown in FIG. 4 mentioned earlier following the same procedures as in Example 1.

The capacitance of each array-type ultrasonic probe was measured by applying a voltage between the first and second electrodes of probe., and counting those of 100 vibrators which had a capacitance less than the reference value which each vibrator would have if none of the piezoelectric elements had not been cracked. The results are shown in Table 7 below. Note that the capacitance measurement was performed for each probe not connected to the cables described above.

Each ultrasonic probe subjected to the above capacitance measurement was disassembled, and the number of cracks of the 100 piezoelectric elements removed was counted by observing the upper and side surfaces of the piezoelectric elements by using a microscope. The result is also shown in Table 7.

Each of the sintered bodies (piezoelectric materials) of Examples 1 to 47 and the single crystals (piezoelectric materials) of Examples 48 to 50 contains a composition which is represented by $xPb(Sc_{\frac{1}{2}}Nb_{\frac{1}{2}})O_3-yPbTiO_3-zPbZrO_3-wPb(Me_{\frac{1}{3}}Nb_{\frac{2}{3}})O_3$ wherein Me represents at least one metal selected from the group consisting of Mg, Zn, and Ni, and $x+y+z+w=1.00$. Here, x, y, z and w are defined as values found in a region drawn as the trigonal pyramid 2 by linearly connecting points a (X=0.72, Y=0.28, Z=0.00, W=0.00), b (X=0.02, Y=0.98, Z=0.00, W=0.00), c (X=0.02, Y=0.28, Z=0.70, W=0.00), and d (X=0.02, Y=0.20, Z=0.00, W=0.78), all existing on the faces of the regular trigonal pyramid 1 shown in FIG. 1, the region excluding the line ab. Therefore, as is apparent from Tables 1 to 6, each of the piezoelectric materials had a large electromechanical coupling coefficient $k_{33}'$ in the direction of thickness of 50% or more (80% or more in the case of the single crystal), when it was formed into a rectangular piezoelectric element having a width of 200 μm. It was also found that there was almost no decrease in the electromechanical coupling coefficient $k_{33}'$ even when the width was decreased to 100 μm.

In addition, in the sintered bodies (piezoelectric materials) of Examples 1 to 47 and the single crystals (piezoelectric materials) of Examples 48 to 50 , no cracks or almost no cracks were formed during the cutting step for assembling into an ultrasonic probe. That is, each piezoelectric material of the present invention had a high fracture toughness. This makes it possible to increase productivity and also realize an ultrasonic probe with a long operating life resulting from the high fracture toughness of the piezoelectric elements.

Comparative Examples 1 to 11 of piezoelectric materials were made, each of which contained, as shown in Table 7, a composition whose x, y, z and w values fall outside the region drawn as a trigonal pyramid 2 shown in FIG. 1. More specifically, each Comparative Example was prepared in the form of two rectangular piezoelectric elements, one having a width of 200 μm and the

TABLE 7

| Comparative Example | x*1 (mol) | y*1 (mol) | z*1 (mol) | w*1 (mol) | Me*2 element | Additive | Content of additive (mol %) | Substitution component of Pb | Substituon amount (mol %) | Sintering temperature (°C.) |
|---|---|---|---|---|---|---|---|---|---|---|
| 1 | 1.00 | 0.00 | 0.00 | 0.00 | — | — | — | — | — | 1300 |
| 2 | 0.80 | 0.20 | 0.00 | 0.00 | — | — | — | — | — | 1300 |
| 3 | 0.54 | 0.46 | 0.00 | 0.00 | — | — | — | — | — | 1275 |
| 4 | 0.55 | 0.45 | 0.00 | 0.00 | — | — | — | — | — | 1275 |
| 5 | 0.57 | 0.43 | 0.00 | 0.00 | — | — | — | — | — | 1250 |
| 6 | 0.60 | 0.40 | 0.00 | 0.00 | — | — | — | — | — | 1275 |
| 7 | 0.30 | 0.15 | 0.55 | 0.00 | — | — | — | — | — | 1275 |
| 8 | 0.00 | 0.50 | 0.50 | 0.00 | — | — | — | — | — | 1250 |
| 9 | 0.45 | 0.45 | 0.10 | 0.00 | — | — | — | — | Sr | 30 | 1275 |
| 10 | 0.00 | 0.47 | 0.53 | 0.00 | — | $Nb_2O_5$ | 2.0 | — | — | 1250 |
| 11 | 0.47 | 0.43 | 0.10 | 0.00 | — | $Ta_2O_5$ | 5.0 | — | — | 1300 |

| Comparative Example | Dielectric constant | Kp (%) | k33 (%) | k33' for width of 200 μm (%) | k33' for width of 100 μm (%) | Number of vibrators having a capacitance less than reference value | Number of cracks in 100 μm-wide piezoelectric elements |
|---|---|---|---|---|---|---|---|
| 1 | No dense sintered body was obtained | | | | | | |
| 2 | 700 | 30 | 35 | 35 | 31 | 18/100 | 18/100 |
| 3 | 1600 | 36 | 40 | 40 | 36 | 12/100 | 13/100 |
| 4 | 2000 | 40 | 48 | 47 | 41 | 20/100 | 19/100 |
| 5 | 2400 | 46 | 53 | 47 | 39 | 12/100 | 12/100 |
| 6 | 1000 | 42 | 46 | 42 | 37 | 22/100 | 21/100 |
| 7 | 800 | 45 | 49 | 46 | 40 | 16/100 | 17/100 |
| 8 | 900 | 41 | 55 | 49 | 43 | 13/100 | 11/100 |
| 9 | 600 | 38 | 46 | 38 | 32 | 14/100 | 13/100 |
| 10 | 1900 | 65 | 74 | 66 | 59 | 15/100 | 14/100 |
| 11 | No dense sintered body was obtained | | | | | | |

*1; x, y, z, and w represent $Pb(Sc_{\frac{1}{2}}Nb_{\frac{1}{2}})O_3$, $PbTiO_3$, $PbZrO_3$, and $Pb(Me_{\frac{1}{3}}Nb_{\frac{2}{3}})O_3$, respectively.
*2; Me element for $(Pb(Me_{\frac{1}{3}}Nb_{\frac{2}{3}})O_3)$.

outer having a width of 100 μm. As shown in Table 7, too, the rectangular piezoelectric element having a width 100 μm had an electromechanical coupling coefficient far smaller than that of the rectangular piezoelectric element having a width of 200 μm. Furthermore, during the cutting step for assembling into an ultrasonic probe, sintered bodies of Comparative Examples 1 to 11 had more cracks than Examples 1 to 47, as can be understood by comparing Table 7 with Tables 1 to 5.

According to the present invention as has been described above, there can be provided a piezoelectric material using a high fracture toughness and maintaining a large electromechanical coupling coefficient $k_{33}'$ in the direction of thickness when it is formed into a rectangular piezoelectric element.

In addition, a piezoelectric element with a width of 100 μm or smaller and a large electromechanical coupling coefficient $k_{33}'$ in the direction of thickness can be formed from the piezoelectric material without causing cracks. This makes it possible to realize an ultrasonic probe including this piezoelectric element and having a high resolution, a high sensitivity, and a long operating life.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A piezoelectric material containing a composition which is represented by $xPb(Sc_{\frac{1}{2}}Nb_{\frac{1}{2}})O_3\text{-}yPbTiO_3\text{-}zPbZrO_3\text{-}wPb(Me_{\frac{1}{3}}Nb_{\frac{2}{3}})O_3$, where Me is at least one metal selected from the group consisting of Mg, Zn and Ni, and $x+y+z+w=1.00$, x, y, z, and w being values falling within a region which is defined by connecting points a, b, c and d and which excludes a lien ab, said points a, b, c and d existing on the faces of a regular trigonal pyramid having apices $P_1$, $P_2$, $P_3$ and $P_4$ which correspond to $Pb(Sc_{\frac{1}{2}}Nb_{\frac{1}{2}})O_3$, $PbTiO_3$, $PbZrO_3$ and $Pb(Me_{\frac{1}{3}}Nb_{\frac{2}{3}})O_3$, respectively, and said points a, b, c and d having the following coordinate values when said apices $P_1$, $P_2$, $P_3$, and $P_4$ have coordinate values of $(X_1, Y_1, Z_1, W_1=1, 0, 0, 0)$, $(X_2, Y_2, Z_2, W_2=0, 1, 0, 0)$, $(X_3, Y_3, Z_3, W_3=0, 0, 1, 0)$, and $(X_4, Y_4, Z_4, W_4=0, 0, 0, 1)$:

|   | X | Y | Z | W |
|---|---|---|---|---|
| a | 0.72 | 0.28 | 0.00 | 0.00 |
| b | 0.02 | 0.98 | 0.00 | 0.00 |
| c | 0.02 | 0.28 | 0.70 | 0.00 |
| d | 0.02 | 0.20 | 0.00 | 0.78 |

2. The piezoelectric material according to claim 1, wherein said composition contains $Pb(Sc_{\frac{1}{2}}Nb_{\frac{1}{2}})O_3$, $PbTiO_3$, $PbZrO_3$ and $Pb(Me_{\frac{1}{3}}Nb_{\frac{2}{3}})O_3$.

3. The piezoelectric material according to claim 1, wherein x, y, z, and w are values falling within a region which is defined by connecting points e, f, g, f, h, f, i, and j and which excludes a line ef, said points e, f, g, h, i and j are located on the faces of said regular trigonal pyramid and have the following coordinate values:

|   | X | Y | Z | W |
|---|---|---|---|---|
| e | 0.65 | 0.35 | 0.00 | 0.00 |
| f | 0.55 | 0.45 | 0.00 | 0.00 |
| g | 0.02 | 0.40 | 0.58 | 0.00 |
| h | 0.02 | 0.50 | 0.48 | 0.00 |
| i | 0.02 | 0.28 | 0.00 | 0.70 |
| j | 0.02 | 0.38 | 0.00 | 0.60 |

4. The piezoelectric material according to claim 1, wherein x, y, z, and w are values falling within a region which is defined by connecting points g, h, i, j, k, l, m, and n, and said points g, h, i, j, k, l, m, and n are located on the faces of said trigonal pyramid and have following coordinate values:

|   | X | Y | Z | W |
|---|---|---|---|---|
| g | 0.02 | 0.40 | 0.58 | 0.00 |
| h | 0.02 | 0.50 | 0.48 | 0.00 |
| i | 0.02 | 0.28 | 0.00 | 0.70 |
| j | 0.02 | 0.38 | 0.00 | 0.60 |
| k | 0.64 | 0.35 | 0.01 | 0.00 |
| l | 0.54 | 0.45 | 0.01 | 0.00 |
| m | 0.64 | 0.35 | 0.00 | 0.01 |
| n | 0.54 | 0.45 | 0.00 | 0.01 |

5. The piezoelectric material according to claim 1, wherein in said composition (including the line ab), a portion of Pb is substituted by not more than 25 mol % with at least one element selected from the group consisting of Ba, Sr, and Ca.

6. The piezoelectric material according to claim 1, wherein said composition (including the line ab) further contains 0.001 to 3 mol % of at least one oxide selected from the group consisting of $La_2O_3$, $Nb_2O_5$, $Ta_2O_5$, $WO_3$, $MnO$, and $CoO$.

7. The piezoelectric material according claims 5 and 6, wherein said composition contains $Pb(Sc_{\frac{1}{2}}Nb_{\frac{1}{2}})O_3$, $PbTiO_3$ and at least one component selected form the group consisting of $PbZrO_3$ and $Pb(Me_{\frac{1}{3}}Nb_{\frac{2}{3}})O_3$.

8. An ultrasonic probe comprising:
a piezoelectric element having an ultrasonic transmitting/receiving surface; and
a pair of electrodes formed on the ultrasonic transmitting/receiving surface of said piezoelectric element and a surface opposite to said transmitting/receiving surface, respectively, and
wherein said piezoelectric element consists of a piezoelectric material containing a composition which is represented by $xPb(Sc_{\frac{1}{2}}Nb_{\frac{1}{2}})O_3\text{-}yPbTiO_3\text{-}zPbZrO_3\text{-}wPb(Me_{\frac{1}{3}}Nb_{\frac{2}{3}})O_3$, where Me is at least one metal selected from the group consisting of Mg, Zn and Ni, and $x+y+z+w=1.00$, x, y, z, and w being values falling within region which is defined by connecting points a, b, c, and d and which excludes a line ab, said points a, b, c, and d existing on the faces of a regular trigonal pyramid having apices $P_1$, $P_2$, $P_3$ and $P_4$ which correspond to $Pb(Sc_{\frac{1}{2}}Nb_{\frac{1}{2}})O_3$, $PbTiO_3$, $PbZrO_3$ and $Pb(Me_{\frac{1}{3}}Nb_{\frac{2}{3}})O_3$, respectively, and said points a, b, c, and d having the following coordinate values when said apices $P_1$, $P_2$, $P_3$, and $P_4$ have coordinate values of $(X_1, Y_1, Z_1, W_1=1, 0, 0, 0)$, $(X_2, Y_2, Z_2, W_2=0, 1, 0, 0)$, $(X_3, Y_3, Z_3, W_3=0, 0, 1, 0)$, and $(X_4, Y_4, Z_4, W_4=0, 0, 0, 1)$:

|   | X | Y | Z | W |
|---|---|---|---|---|
| a | 0.72 | 0.28 | 0.00 | 0.00 |
| b | 0.02 | 0.98 | 0.00 | 0.00 |
| c | 0.02 | 0.28 | 0.70 | 0.00 |
| d | 0.02 | 0.20 | 0.00 | 0.78 |

9. The probe according to claim 8, wherein said composition contains $Pb(Sc_{\frac{1}{2}}Nb_{\frac{1}{2}})O_3$, $PbTiO_3$, $PbZrO_3$ and $Pb(Me_{\frac{1}{3}}Nb_{\frac{2}{3}})O_3$.

10. The probe according to claim 8, wherein x, y, z and w are values falling within a region which is defined by connecting points e, f, g, h, i, and j and which excludes a line ef, said points e, f, g, h, i and j are located on the faces of said regular trigonal pyramid and have the following coordinate values:

|   | X | Y | Z | W |
|---|---|---|---|---|
| e | 0.65 | 0.35 | 0.00 | 0.00 |
| f | 0.55 | 0.45 | 0.00 | 0.00 |
| g | 0.02 | 0.40 | 0.58 | 0.00 |
| h | 0.02 | 0.50 | 0.48 | 0.00 |
| i | 0.02 | 0.28 | 0.00 | 0.70 |
| j | 0.02 | 0.38 | 0.00 | 0.60 |

11. The probe according to claim 8, wherein x, y, z and w are values falling within a region which is defined by connected points g, h, i, j, k, l, m, and n, and said points g, h, i, J, k, l, m and n are located on the faces of said trigonal pyramid and have following coordinate values:

|   | X | Y | Z | W |
|---|---|---|---|---|
| g | 0.02 | 0.40 | 0.58 | 0.00 |
| h | 0.02 | 0.50 | 0.48 | 0.00 |
| i | 0.02 | 0.28 | 0.00 | 0.70 |
| j | 0.02 | 0.38 | 0.00 | 0.60 |
| k | 0.64 | 0.35 | 0.01 | 0.00 |
| l | 0.54 | 0.45 | 0.01 | 0.00 |
| m | 0.64 | 0.35 | 0.00 | 0.01 |
| n | 0.54 | 0.45 | 0.00 | 0.01 |

12. The probe according to claim 8, wherein in said composition (including the line ab), a portion of Pb is substituted by not more than 25 mol % with at least one element selected from the group consisting of Ba, Sr, and Ca.

13. The probe according to claim 8, wherein said composition (including the line ab) further contains 0.001 to 3 mol % of at least one oxide selected from the group consisting of $La_2O_3$, $Nb_2O_5$, $Ta_2O_5$, $WO_3$, MnO, and CoO.

14. The probe according claims 12 and 13, wherein said composition contains $Pb(Sc_{\frac{1}{2}}Nb_{\frac{1}{2}})O_3$, $PbTiO_3$ and at least one component selected form the group consisting of $PbZrO_3$ and $Pb(Me_{\frac{1}{3}}Nb_{\frac{2}{3}})O_3$.

* * * * *